United States Patent
Yang

(10) Patent No.: US 7,582,511 B2
(45) Date of Patent: Sep. 1, 2009

(54) METHOD FOR WAFER LEVEL CHIP SCALE PACKAGING WITH PASSIVE COMPONENTS INTEGRATED INTO PACKAGING STRUCTURE

(75) Inventor: Chen Hsiung Yang, Taoyuan Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 370 days.

(21) Appl. No.: 11/434,734

(22) Filed: May 17, 2006

(65) Prior Publication Data

US 2007/0161155 A1 Jul. 12, 2007

(30) Foreign Application Priority Data

Jan. 12, 2006 (TW) .............................. 95101214 A

(51) Int. Cl.
*H01L 21/00* (2006.01)
(52) U.S. Cl. .................. 438/110; 257/E23.113
(58) Field of Classification Search .................. 438/110; 257/E23.113
See application file for complete search history.

(56) References Cited

U.S. PATENT DOCUMENTS

| 6,784,530 B2 * | 8/2004 | Sugaya et al. ............... 257/686 |
| 2005/0073040 A1 * | 4/2005 | Lee et al. ..................... 257/698 |
| 2008/0265401 A1 * | 10/2008 | Lee et al. ..................... 257/700 |

* cited by examiner

*Primary Examiner*—Matthew Smith
*Assistant Examiner*—Walter H Swanson
(74) *Attorney, Agent, or Firm*—Winston Hsu

(57) ABSTRACT

The present invention provides a Wafer Level Chip Scale Packaging structure including a die, at least one passive component, a combining layer, an isolating layer, at least one connecting wire, an internal pad and a passivation layer. The die includes a shallow connecting pad, an internal pad and an electrical component. The passive component is formed on one side of the die. The combining layer increases the binding force between the passive component and the die. The part surface on the other side of the die is overlaid with the isolation layer. The part surface of the isolation layer and the internal pad is overlaid with the connecting wire to electrically connect to the internal pad, and the passivation layer is used for protecting the die.

22 Claims, 4 Drawing Sheets

METHOD FOR WAFER LEVEL CHIP SCALE PACKAGING WITH PASSIVE COMPONENTS INTEGRATED INTO PACKAGING STRUCTURE

BACKGROUND OF THE PRESENT INVENTION

1. Field of Invention

The invention relates to a system with an integrated packaging manufacturing method, and more particularly to a wafer level integrated packaging manufacturing method forming at least a passive component in the packaging structure to reduce the package volume and the system volume and decrease the signal degeneration due to the external connecting with passive components and breakdown problems.

2. Description of Related Arts

With the long time development, the IC packaging method can be categorized as pin through hole and surface mounting. The surface mounting method is processed to achieve an electric connecting through metal pads and substrate.

In a developing process for the surface mounting, there are some methods developed for an increasing of an integration of IC, such as the chip scale package (CSP) employed for the volume ratio of the naked die to the package less than 1:5. The CSP is achieved by fine pinch ball grid array or flip chip. There are many modified methods in the conventional flip chip packaging process. No matter what kind of modification, the flip chip packaging process employs the front surface of a wafer to achieve the electric connecting, such as the U.S. Pat. Nos. 5,720,100, 6,074,895, and 6,372,544. They all disclosed the flip chip structure as mentioned above. Therefore, those who employ the semiconductor structure of the front surface of a wafer, such as the photo sensor (CMOS or CCD structure), pressure sensor, or thermal sensor, cannot employ the flip chip packaging method.

Meanwhile, the wafer level chip scale package (WLCSP), which the volume ratio of the naked die to wafer is close to 1:1, is developed. WLCSP employs two surfaces and the lateral side of a wafer to process packaging so that the package volume can be reduced further.

An integrated method to integrate the passive components in the semiconductor packaging structure employing a semiconductor manufacturing process is developed to reduce the electronics system volume and decrease the signal degeneration due to the external connecting with passive components and the breakdown probability due to the malconnecting. But it needs the extra manufacturing process to form passive components. Not only the manufacturing process is complicated, but also does the breakdown problems of the manufacturing process increase.

Therefore, there is a need to provide an integrated packaging process and structure to integrate passive components in the packaging structure to reduce the system volume and increase the reliability through the integration of the passive components when processing the wafer level packaging.

SUMMARY OF THE PRESENT INVENTION

An object of the present invention is to provide an integrated packaging process forming at least a passive component in a packaging structure to reduce the package volume effectively.

Another object of the present invention is to provide an integrated packaging process employing the front and back surfaces of a wafer for packaging to reduce the package volume and area effectively.

Another object of the present invention is to provide an integrated packaging process employing BCB, polyimide, and other equivalent electric isolating materials, and isolating the wafer electrically.

Another object of the present invention is to provide an integrated packaging process integrating passive components in the wafer structure to reduce the signal degeneration, and decrease the additional system area caused by the packaging structure.

Another object of the present invention is to provide an integrated packaging process comprising a packaging passivation layer to provide protection so that the structure is easily to recover to increase the yield when the defects are generated in the manufacturing process.

Another object of the present invention is to provide a packaging structure, different from the flip chip structure, not to employ the front surface of a wafer for packaging, and capable of applied to the packaging of the devices including the sensing area for light, pressure, and temperature.

Accordingly, in order to accomplish the one or some or all above objects, the present invention provides an integrated packaging process, comprising the steps as the following:

forming a barrier layer and a seed layer on a surface of a wafer, wherein the wafer comprises at least a shallow connecting pad, at least an internal pad, and at least an electrical component;

forming a photo resist layer on the seed layer, and forming an opening in the photo resist layer at the corresponding location of the connecting pad, wherein the opening is used to define the shape and size of at least a passive component;

forming at least a passive component at the location of the opening, wherein the characteristics of the passive component are determined by the shape and size of the opening;

removing the photo resist layer and the seed layer;

coating an electric-isolating material over the surface of the wafer and covering the passive component to form a combining layer;

forming a passivation layer combined with the combining layer to provide protection for the packaging structure, wherein the passivation is intended to be a carrier;

forming a masking layer on another surface of the wafer, and forming an opening at the corresponding location of at least an internal metal connecting pad in the masking layer;

etching another surface of the wafer, removing the unmasked area of the wafer to form at least an opening, and then forming a isolation layer and a connecting wire layout in order on another surface, wherein the connecting wire layout is electrically connected to the internal metal pad through the opening.

Accordingly, in order to accomplish the one or some or all above objects, the present invention provides a packaging structure, comprising:

a wafer, comprising at least a shallow connecting pad, at least an internal connecting pad, and at least an electrical component, wherein the electrical component locates in the wafer;

at least a passive component forming on the surface of the wafer;

an isolation layer covering a part of another surface of the wafer;

at least an connecting wire covering the isolation layer and at least an opening of an internal connecting pad to electrically connect with the internal connecting pad;

a combining layer, locating on the surface of the wafer and the passive component; and a passivation layer, connected to the semiconductor structure through the combining layer.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

Figure 1:
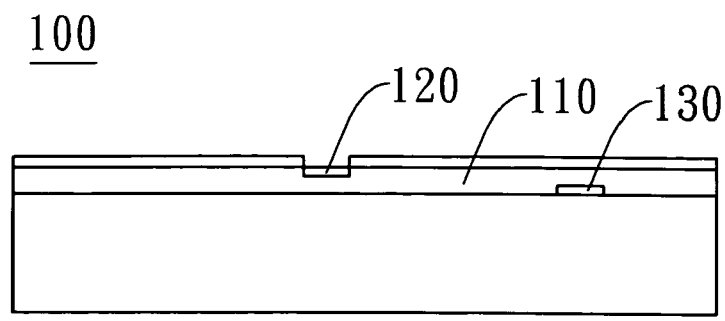
FIG. 1 illustrates a diagram of a wafer in accordance with a preferred embodiment of the present invention.

Referring to the FIG. 1, it is a wafer 100 in accordance with the preferred embodiment of the present invention. The wafer 100 comprises at least an electrical component 110, at least a shallow connecting pad 120, and at least an internal connecting pad 130. The electrical component 110 locates on the wafer 100. The shallow connecting pad 120 locates on a surface of the wafer 100. The internal connecting pad 130 locates on the wafer 100 and is electrically connected to the electrical component 110.

At first, a surface activation manufacturing process is optional to proceed depending on the need. The surface activation manufacturing process is used to remove the pollution on the surface of the wafer and the shallow connecting pad, such as the oxides or particles, to increase the adherence between the surface of the wafer and the shallow connecting pad. In the embodiment, the surface activation manufacturing process may be implemented by wet etching, dry etching, plasma etching, or the combination thereof, but not restricted.

Figure 2A:
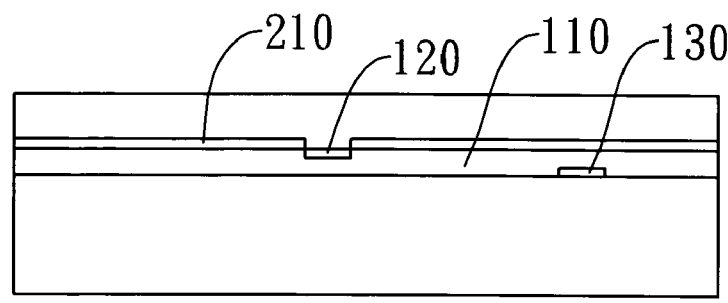
FIG. 2A-2D illustrate the forming steps of the passive component and passivation layer in accordance with a preferred embodiment of the present invention.

Referring to FIG. 2A, the wafer 100 comprises at least a photo sensing dielectric layer (photo resist layer) 210 formed at a lateral side of the shallow connecting pad 120. The photo sensing dielectric layer 210 covers the surface of the wafer 100 and at least a shallow connecting pad 120 to provide a dielectric protection for the wafer 100. The material of the photo sensing dielectric layer 210 needs to comprise the following characteristics: the dielectricity of the material has to provide enough electricity protection; the material has to be a photo sensing material to form a pattern defined by exposing and developing. In the embodiment, the photo sensing dielectric layer 210 may comprise the photosensitive benzocyclobutene (BCB) or polyimide, but not restricted.

Figure 2B:
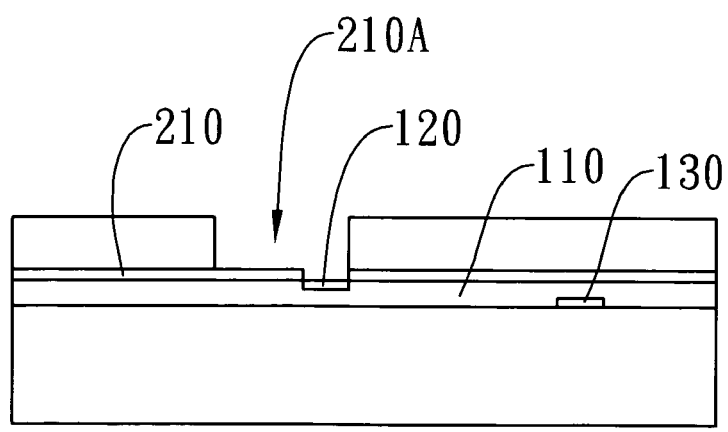

Referring to FIG. 2B, the following step is to process exposing and developing. The exposing and developing process is used to form at least an opening 210A in the photo sensing dielectric layer 210. The opening 210A is in the proximate area of the corresponding part of the shallow connecting pad 120, and the shallow connecting pad 120 has to be exposed out. The opening 210A is used to define at least a passive component 260, such as the planner inductor. The characteristics of the passive component 260 may be controlled by the size, shape, thickness, and surface state of the opening 210A.

Figure 2C:
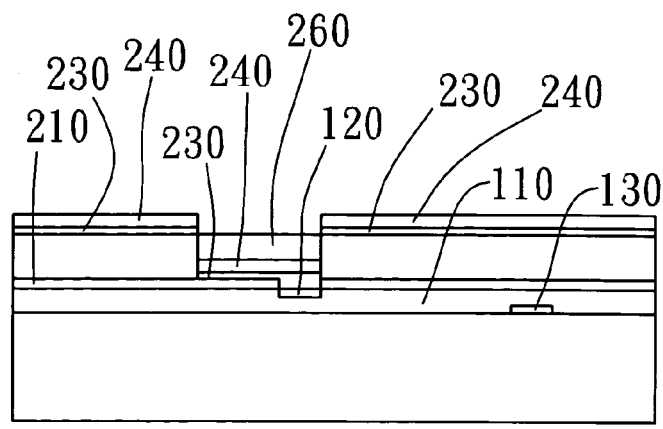
Figure 2D:
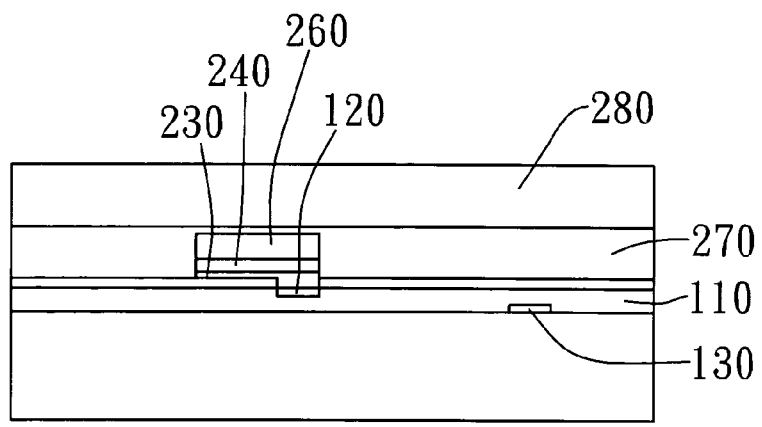

Referring to FIG. 2C, it is the manufacturing process of a passive component in accordance with the preferred embodiment of the present invention. A barrier layer 230 and a seed layer 240, the interfacing layer, are formed on the photo sensing dielectric layer 210 and the shallow connecting pad 120 in order.

The barrier layer 230 is the buffering layer between shallow connecting pad 120 and the dielectric layer. By employing the barrier layer 230, the problem due to the high diffusion coefficient of the copper and the electricity degeneration of the device when forming deep energy levels in the silicon substrate can be resolved, even the problem of the low adherent ability for the copper to the dielectrics. The conventional material employed in the barrier layer 230 is tungsten (W), titanium-tungsten (TiW), Ta/TaN, Ti/TiN, or the combination thereof, but not restricted. The seed layer 240 provides the required seed for forming the metal layer and avoid the peeling problem due to the large stress. The employed material in the seed layer 240 depends on the metal layer. The conventional material is copper or gold, but not restricted.

Next, at least a passive component 260 is formed on the seed layer 240. The passive component 260 may be formed by electroplating or electroless plating. It may also be implemented by CVD, plasma enhanced CVD or other PVD methods, but not restricted.

Referring to 2D, the areas uncovered by the passive component 260 in the barrier layer 230 and the seed layer 240 are removed. And then the annealing is processed to further increase the binding force between the seed layer 240 and the passive component 260 and decrease the impedance of the passive component. After that, a wafer protection process is preceded by coating electricity isolating material on the surface of the wafer 100 and covering the passive component 260 to form a combining layer 270. The combining layer is adhesive and used for electrical isolation to provide protection in the manufacturing process. In a preferred case, the photosensitive BCB and polyimide are employed as the combining layer, but not restricted. The epoxy and UV glue are also the conventional combining materials. A passivation layer 280 locates on the wafer is combined with the wafer 100 by the adherence or other mechanic binding force of the combining layer 270. The passivation layer 280 provides the protection for the packaging structure. It is noted that the material of the passivation 280 has to allow the light to penetrate if the operation of the packaging structure comprises a photo sensing process (such as the CMOS or CCD). In the embodiment, it is transparent.

It is noted that the manufacturing process to form a passive component in the present invention includes another modified embodiment. In the modified embodiment, the barrier layer 230 and the seed layer 240 are formed on the surface of the wafer 100 first, and then the exposing and developing process is preceded to form a photo resist layer (not shown) to define the passive component 260. The photo resist layer, extra barrier 230 and seed layer 240 are removed after the passive component is formed. Next, the combining layer 270 is coated over the wafer 100 and the passive component 220. And then the combining layer 270 is employed to combine the passivation layer 280.

Figure 3A:
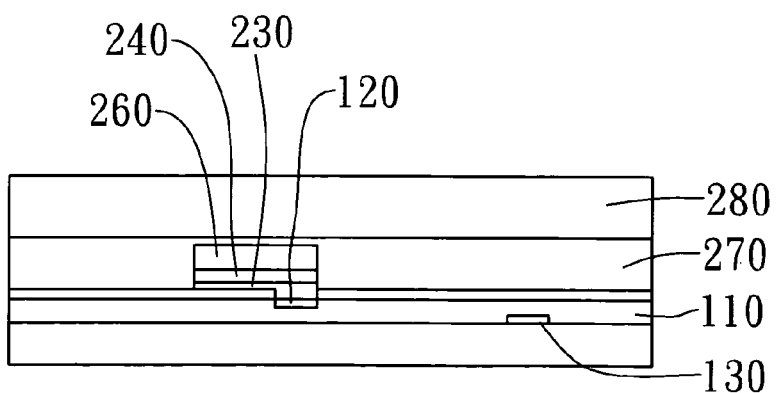
FIG. 3A-3F illustrate the forming steps of the connecting wire in accordance with a preferred embodiment of the present invention.

After that, referring to FIG. 3A, the wafer thinning process is preceded on another surface of the wafer 100. The process to reduce the thickness of the wafer is achieved by polishing, CMP, chemical etching, plasma etching or other physics and chemical etching methods. In the preferred embodiment, a two-step thinning process comprises the first thinning process and the second thinning process. The first thinning process employs the grinding, polishing, and the combination thereof to thin the wafer fast under the condition not to damage the wafer. And then the second thinning process is employed to further thin the wafer uniformly by CMP, plasma etching or wet etching.

Figure 3B:
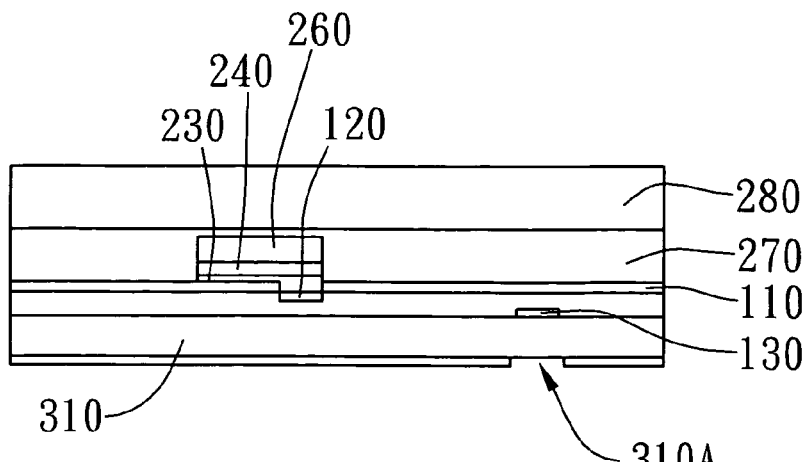

Referring to FIG. 3B, a masking layer is formed on another surface of the wafer 100. At least an opening 310A in the proximate area of the corresponding location of the internal connecting pad 130 is formed in the masking layer 310, and the internal connecting pad 130 has to be exposed out. In the embodiment, the masking layer 310 is a photo resist material layer. The masking layer 310 and the opening 310A are formed by exposing and developing, but not restricted. For example, it is an alternative method to form at least an opening by etching after the process of the oxidation or nitridation.

Figure 3C:
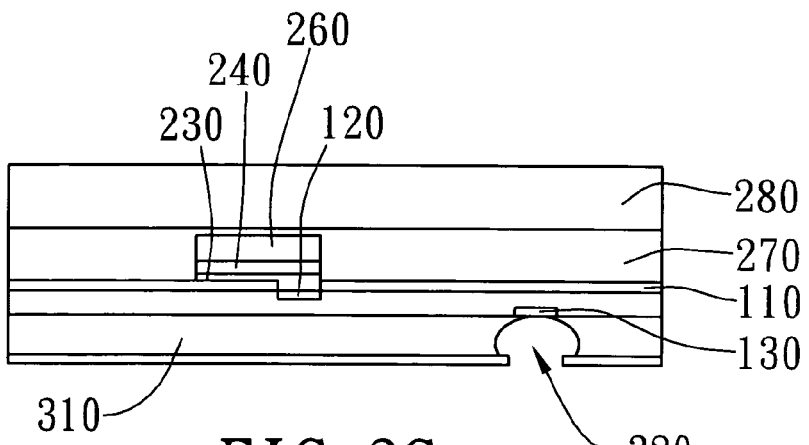

Referring to FIG. 3C, the partial wafer 100 in the opening 310A is removed by etching. At this moment, the internal connecting pad 130 is not exposed out yet. It is noted that the process may be replaced by any anisotropic etching method. Anisotropic etching means not only the vertical portion is etched, but also is the lateral portion etched. The lateral etching causes the so-called undercut effect. In the prior art, the mentioned undercut effect cannot precisely transfer the pattern to the wafer. But in the embodiment, the expanded opening caused by the undercut effect is employed to help form an open structure toward the outside. In another word, it is a bow-shaped structure with an area of the opening bigger than the area of the bottom surface. The mentioned anisotropic etching may be achieved by a wet etching or reactive ion etching.

Figure 3D:
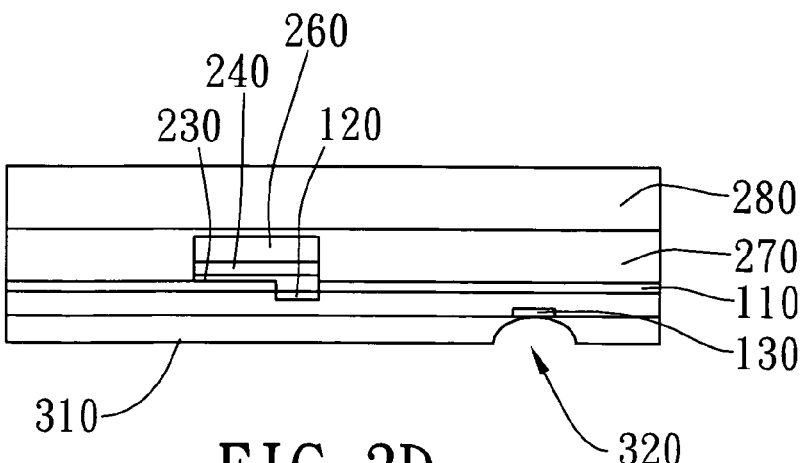

Referring to FIG. 3D, the surface of wafer 100 comprising the internal connecting pad 130 is processed in anisotropic etching to remove the masking layer and further to remove the part of the wafer 100 until the internal connecting pad is expose out, and a wafer opening 320 of the internal connecting pad 130 is exposed to form an open structure toward the outside. In another word, it is a bow-shaped structure with an area of the opening bigger than the area of the bottom surface. The structure is used to maintain the reliability of the wiring layout formed by the following manufacturing process. Basically, the mentioned anisotropic etching is a kind of the physics reaction. Therefore, the bumping of the ions not only removes the etched film but also the photo resist mask. The mentioned mechanism of the anisotropic etching may be dry etching, usually a plasma etching. The plasma etching is the physic reaction when the ions of the plasma hit the surface of the wafer, or chemical reaction between the radical of the plasma react and the atoms of surface of the wafer, or even the combination of both.

The mentioned two-step etching process is used to form an open structure toward the outside. It is possible to employ a single step process to achieve the same result. For example, an isotropic etching and anisotropic etching may be employed to achieve the open structure toward the outside by controlling the concentration, flow rate, and the other parameters.

Figure 3E:
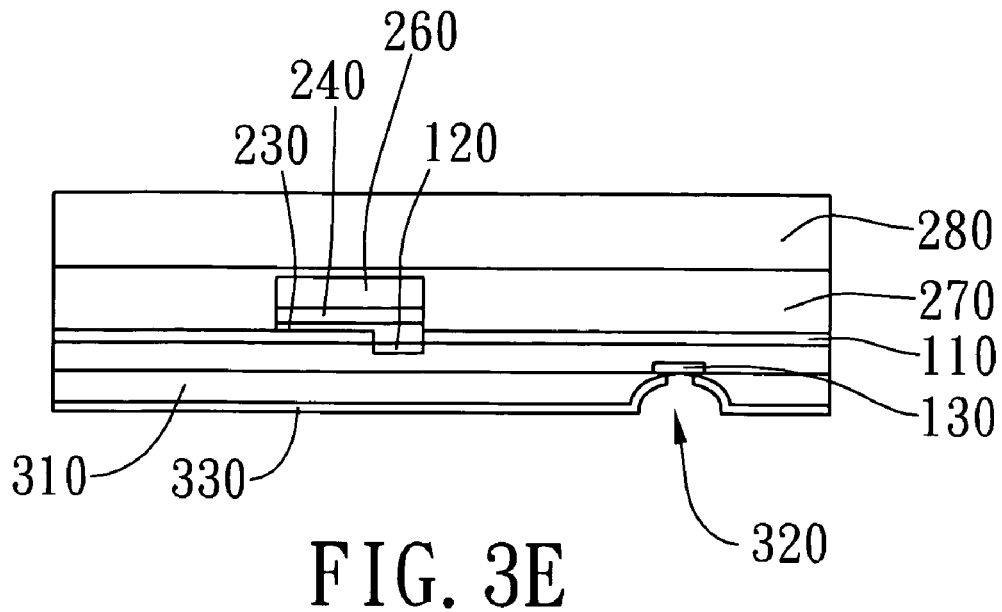

Referring to FIG. 3E, in the following step, an isolation layer 330 is deposited on the surface, comprising at least an internal pad 130, of the wafer 100. The isolation layer 330 provides the required electricity isolation for the wafer 100. And then a photo resist layer (not shown) is formed over the isolation layer 330. At least a connecting opening is formed in the proximate area of the corresponding portion of the internal connecting pad 130 by exposing and developing. An etching process is employed to remove the isolation layer inside the opening 320 to expose the internal connecting pad 130 and remove the photo resist layer.

Figure 3F:
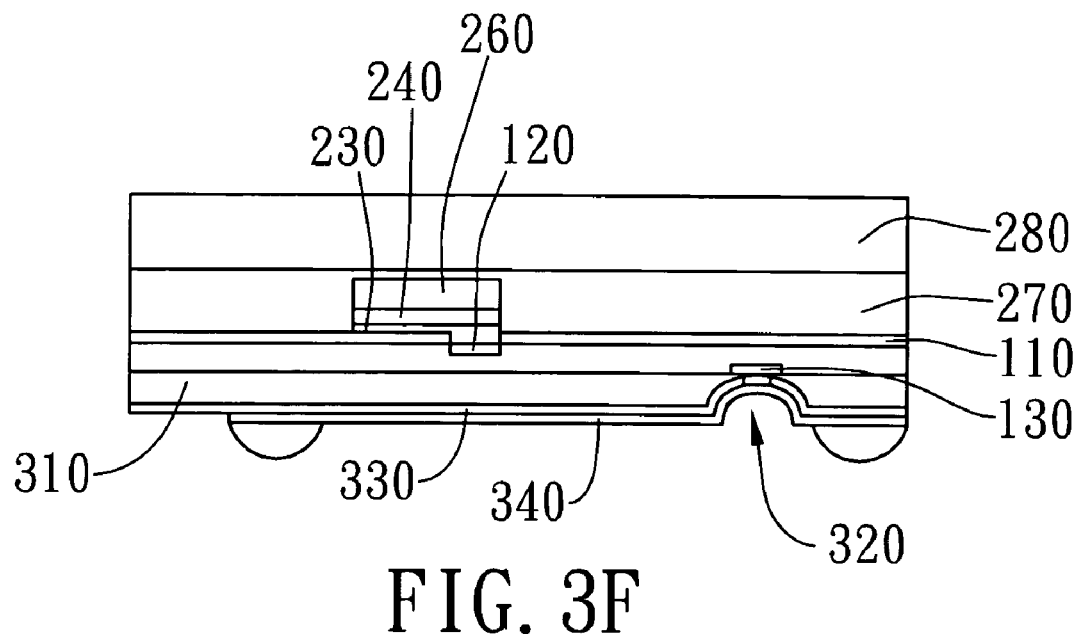

Referring to FIG. 3F, at last, a connecting wire manufacturing process is employed. A wiring layout 340 is formed on the isolation layer 330 to electrically connect with the internal connecting pad 130. In the preferred embodiment, the wiring layout is electrically connected to the internal connecting pad 130 through the open structure toward the outside so as to avoid the indifferent deposition result of the isolation layer 330 and the wiring layout caused by the steep slope and the reliability of the electricity caused by the over proximity of the wires at the two sides of the opening. The wiring manufacturing process may comprise: forming a conducting layer over the surface, comprising at least an internal connecting pad 130, of the wafer 100 in a deposition process; defining the wiring layout by a wiring layout photo resist; and etching the conducting layer to finish the circuit layout. But it is not restricted. For example, the shadow mask cooperating with the thin film technology is also able to define the wiring layout on the wafer 100.

The present invention totally employs the two surfaces of wafer to process packaging. By integrating the wafer packaging and the manufacturing process of passive components, the required time and complexity of the manufacturing process, the packaging time, the signal degeneration caused by connecting with the external passive components, and the indifferent effect to the system caused by the noise are all reduced. By employing the passivation layer, the yields of the wafer and passive components are increased. And it is easy to recover when the manufacturing process generates defects. Meanwhile, the manufacturing process in accordance with the present invention is compatible with the standard semiconductor manufacturing process. Besides, the combining layer achieves the electrical protection of the wafer and the passive components and the combining action to cover the chip. Because the way of the electrical connecting is different from the flip chip structure, the packaging structure can be applied to the photo sensing devices or ink-jet head devices, which comprises the device packaging including the positive sensing area, by employing the transparent passivation layer. It can also integrates the alternative passive components, such as the photo sensitive devices, detecting devices, and metal bumps, into a reliable, effective, and integrated packaging structure.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive.

Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An integrated wafer packaging method, comprising: forming an interfacing layer on a surface, comprising a shallow connecting pad, of a wafer; forming a photo resist layer comprising at least an opening in a proximate area of a corresponding area of the shallow connecting pad, wherein the opening defines a shape and a size of at least a passive component; forming at least a passive component on the at least an opening and then removing the photo resist layer; forming a masking layer on another surface of the wafer, wherein the masking layer comprising at least an opening in the proximate area of the corresponding location of an internal connecting pad; coating an electricity isolating material on the surface of the wafer and covering at least a passive component to form a combining layer; combining a passivation layer with the combining layer; etching the another surface of the wafer to remove an unmasked portion of the wafer to form at least a wafer opening connected to at least an internal connecting pad; removing the masking layer; forming an isolation layer on the another surface of the wafer; and forming a connecting wire layout over the isolation layer.

2. The integrated wafer packaging method according to the claim 1, wherein the interfacing layer forming step further comprises: forming a barrier layer; and forming a seed layer.

3. The integrated wafer packaging method according to the claim 2, wherein the etching process comprises: an isotropic etching, forming at least an expanded wafer opening; an anisotropic etching, forming a wafer opening toward the outside, wherein the wafer toward the outside is a bow-shaped opening with an opening area bigger than an bottom area.

4. The integrated wafer packaging method according to the claim 3, further comprising a wafer thinning process to thin the wafer before forming the masking layer on the another surface of the wafer, wherein the wafer thinning process comprises a polishing process, a CMP, a wet etching, a plasma etching, and a combination thereof.

5. The integrated wafer packaging method according to the claim 2, further comprising a wafer thinning process to thin the wafer before forming the masking layer on the another surface of the wafer, wherein the wafer thinning process comprises a polishing process, a CMP, a wet etching, a plasma etching, and a combination thereof.

6. The integrated wafer packaging method according to the claim 1, wherein the etching process comprises: an isotropic etching, forming at least an expanded wafer opening; an anisotropic etching, forming a wafer opening toward the outside, wherein the wafer toward the outside is a bow-shaped opening with an opening area bigger than an bottom area.

7. The integrated wafer packaging method according to the claim 6, further comprising a wafer thinning process to thin the wafer before forming the masking layer on the another surface of the wafer, wherein the wafer thinning process comprises a polishing process, a CMP, a wet etching, a plasma etching, and a combination thereof.

8. The integrated wafer packaging method according to the claim 1, further comprising a wafer thinning process to thin the wafer before forming the masking layer on the another surface of the wafer, wherein the wafer thinning process comprises a polishing process, a CMP, a wet etching, a plasma etching, and a combination thereof.

9. The integrated wafer packaging method according to the claim 1, wherein the passive component comprises an inductive device.

10. The integrated wafer packaging method according to the claim 1, wherein the passive component comprises a capacitive device.

11. The integrated wafer packaging method according to the claim 1, wherein the passive component comprises a resistive device.

12. The integrated wafer packaging method according to the claim 1, wherein the passive component comprises a resistive device.

13. An integrated wafer packaging method, comprising: forming a photo resist layer on a surface, comprising a shallow connecting pad, of a wafer; wherein the photo resist layer comprising at least an opening in a proximate area of a corresponding area of the shallow connecting pad, wherein the opening defines a shape and a size of at least a passive component; forming at least a passive component on the at least an opening and then removing the photo resist layer, wherein the combining layer reduces the stress between the at least a passive component and the shallow connecting pad; forming a masking layer on another surface of the wafer, wherein the masking layer comprising at least an opening in the proximate area of the corresponding location of an internal connecting pad; coating an electricity isolating material on the surface of the wafer and covering at least a passive component to form a combining layer; combining a passivation layer with the combining layer; etching the another surface of the wafer to remove an unmasked portion of the wafer to form at least a wafer opening connected to at least an internal connecting pad; removing the masking layer; forming an isolation layer on the another surface of the wafer; and forming a connecting wire layout over the isolation layer.

14. The integrated wafer packaging method according to the claim 13, wherein the interfacing layer forming step further comprises: forming a barrier layer; and forming a seed layer.

15. The integrated wafer packaging method according to the claim 14, wherein the etching process comprises: an isotropic etching, forming at least an expanded wafer opening; an anisotropic etching, forming a wafer opening toward the outside, wherein the wafer toward the outside is a bow-shaped opening with an opening area bigger than an bottom area.

16. The integrated wafer packaging method according to the claim 15, further comprising a wafer thinning process to thin the wafer before forming the masking layer on the another surface of the wafer, wherein the wafer thinning process comprises a polishing process, a CMP, a wet etching, a plasma etching, and a combination thereof.

17. The integrated wafer packaging method according to the claim 14, further comprising a wafer thinning process to thin the wafer before forming the masking layer on the another surface of the wafer, wherein the wafer thinning process comprises a polishing process, a CMP, a wet etching, a plasma etching, and a combination thereof.

18. The integrated wafer packaging method according to the claim 13, wherein the etching process comprises: an isotropic etching, forming at least an expanded wafer opening; an anisotropic etching, forming a wafer opening toward the outside, wherein the wafer toward the outside is a bow-shaped opening with an opening area bigger than an bottom area.

19. The integrated wafer packaging method according to the claim 18, further comprising a wafer thinning process to thin the wafer before forming the masking layer on the another surface of the wafer, wherein the wafer thinning process comprises a polishing process, a CMP, a wet etching, a plasma etching, and a combination thereof.

20. The integrated wafer packaging method according to the claim 13, further comprising a wafer thinning process to thin the wafer before forming the masking layer on the another surface of the wafer, wherein the wafer thinning process comprises a polishing process, a CMP, a wet etching, a plasma etching, and a combination thereof.

21. The integrated wafer packaging method according to the claim 13, wherein the passive component comprises an inductive device.

22. The integrated wafer packaging method according to the claim 13, wherein the passive component comprises a capacitive device.

* * * * *